(12) United States Patent
Kim et al.

(10) Patent No.: US 11,004,703 B1
(45) Date of Patent: May 11, 2021

(54) GAS FLOW GUIDING DEVICE FOR SEMICONDUCTOR PROCESSING APPARATUS AND METHOD OF USING THE SAME

(71) Applicant: XIA TAI XIN SEMICONDUCTOR (QING DAO) LTD., Qingdao (CN)

(72) Inventors: Kunho Kim, Singapore (SG); Jinsun Choi, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/663,386

(22) Filed: Oct. 25, 2019

(51) Int. Cl.
*H01L 21/67* (2006.01)
*C23C 16/455* (2006.01)
*C30B 25/14* (2006.01)
*H01J 37/32* (2006.01)
*C23C 16/458* (2006.01)

(52) U.S. Cl.
CPC .. H01L 21/67069 (2013.01); C23C 16/45565 (2013.01); C23C 16/45591 (2013.01); C30B 25/14 (2013.01); H01J 37/32449 (2013.01); H01L 21/67253 (2013.01); *C23C 16/4585* (2013.01)

(58) Field of Classification Search
CPC ......... H01L 21/67069; H01L 21/67253; C23C 16/45589
See application file for complete search history.

(56) References Cited

U.S. PATENT DOCUMENTS

| | | | | |
|---|---|---|---|---|
| 2,656,782 A | * | 10/1953 | Labus | F24F 13/062 454/302 |
| 2,914,914 A | * | 12/1959 | Vandenberg | F02K 1/1215 60/771 |
| 3,351,155 A | * | 11/1967 | Hoch | F02K 1/46 181/215 |
| 4,424,937 A | * | 1/1984 | Nawa | F15C 1/008 239/590 |
| 5,261,605 A | * | 11/1993 | McLafferty | F02K 1/1223 239/265.33 |
| 5,329,763 A | * | 7/1994 | Ibarreche Mendia | F02K 1/1292 239/265.35 |
| 5,461,856 A | * | 10/1995 | Mendia | F02K 1/008 239/265.35 |
| 5,508,368 A | * | 4/1996 | Knapp | C23C 16/0245 347/203 |
| 5,884,009 A | * | 3/1999 | Okase | H01L 21/67017 219/405 |

(Continued)

*Primary Examiner* — Jeffrie R Lund
*Assistant Examiner* — Stanislav Antolin
(74) *Attorney, Agent, or Firm* — ScienBiziP, P.C.

(57) ABSTRACT

A semiconductor processing apparatus is disclosed, which comprises a chamber body having an interior volume, a substrate support pedestal disposed in the interior volume, a gas outlet member positioned above the substrate support pedestal inside the interior volume, having a plurality of dispense nozzles, and a gas guiding device positioned between the gas outlet member and the substrate support pedestal. The gas guiding device includes a plurality of petal elements pivotally arranged around the dispense nozzles of the gas outlet member and circumferentially overlapping one another, configured to dynamically adjust an output gas distribution over the substrate support pedestal.

14 Claims, 7 Drawing Sheets

(56) References Cited

U.S. PATENT DOCUMENTS

| | | | | |
|---|---|---|---|---|
| 6,045,671 A | * | 4/2000 | Wu | B82Y 25/00 |
| | | | | 506/40 |
| 6,234,611 B1 | * | 5/2001 | Silverbrook | B41J 2/1632 |
| | | | | 347/54 |
| 2003/0010447 A1 | * | 1/2003 | Tzu | H01L 21/67069 |
| | | | | 156/345.26 |
| 2003/0075273 A1 | * | 4/2003 | Kilpela | C23C 16/45565 |
| | | | | 156/345.33 |
| 2005/0046673 A1 | * | 3/2005 | Silverbrook | B41J 2/1639 |
| | | | | 347/54 |
| 2009/0239362 A1 | * | 9/2009 | Hirata | C23C 16/4584 |
| | | | | 438/509 |
| 2012/0048180 A1 | * | 3/2012 | Ito | C23C 16/325 |
| | | | | 117/88 |
| 2013/0255569 A1 | * | 10/2013 | Yamada | H01L 21/02104 |
| | | | | 117/107 |
| 2016/0319425 A1 | * | 11/2016 | Du | C23C 16/4407 |

\* cited by examiner

GAS FLOW GUIDING DEVICE FOR SEMICONDUCTOR PROCESSING APPARATUS AND METHOD OF USING THE SAME

FIELD

The present disclosure generally relates to semiconductor processing apparatus, more specifically to semiconductor processing apparatus that includes a gas outlet member.

BACKGROUND

Modern integrated circuits (IC) are designed to encompass high feature density that may include millions of components such as transistors, capacitors, resistors, and the like. The demand for greater circuit density requires a reduction in the dimensions (or feature size) of the integrated circuit components. The minimal dimensions are commonly referred to as critical dimensions (CDs). The CDs may represent the minimal widths of the features, such as lines, trenched, pitches, stacks, openings, spaces between the lines, and the like.

As the CDs shrink, conditions of processes for fabricating ICs become more significant to maintain high yields. For example, process uniformity across substrates in a processing chamber of a semiconductor apparatus becomes paramount to maintain high yields.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

It is to be noted, however, that the appended drawings illustrate only exemplary embodiments of this disclosure and are therefore not to be considered limiting of its scope, for the disclosure may admit to other equally effective embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the instant disclosure generally relate to a method and apparatus for fabricating a semiconductor substrate in a processing chamber which utilizes a showerhead, also known as a gas distribution plate, for introducing gases into the chamber. Those skilled in the art will understand that other forms of plasma etch chambers may be used to practice the instant disclosure, including reactive ion etch (RIE) chambers, electron cyclotron resonance (ECR) chambers, and the like. Furthermore, embodiments of the instant disclosure may be useful in any processing chamber where flow control may improve process uniformity across the surface of a substrate during processing, such as atomic layer deposition (ALD) chambers, chemical vapor deposition (CVD) chambers, plasma enhanced chemical vapor deposition (PECVD) chambers, magnetically enhanced plasma processing chambers, and the like.

The description will be made as to the exemplary embodiments in conjunction with the accompanying drawings in FIGS. 1 to 7. Reference will be made to the drawing figures to describe the present disclosure in detail, wherein depicted elements are not necessarily shown to scale and wherein like or similar elements are designated by same or similar reference numeral through the several views and same or similar terminology.

Embodiments of the instant disclosure generally relate to a method and apparatus for processing semiconductor substrate in a processing chamber that utilizes a gas out let member, e.g., a gas distribution plate or showerhead for enabling gas passage into the chamber. The instant disclosure may be applied in other forms of plasma etch chambers including reactive ion etch (RIE) chambers, electron cyclotron resonance (ECR) chambers, and the like. Furthermore, embodiments of the instant disclosure may be useful in processing chambers in which flow control may improve process uniformity across the surface of a substrate during processing, such as atomic layer deposition (ALD) chambers, chemical vapor deposition (CVD) chambers, plasma enhanced chemical vapor deposition (PECVD) chambers, magnetically enhanced plasma processing chambers, and the like.

Figure 1:
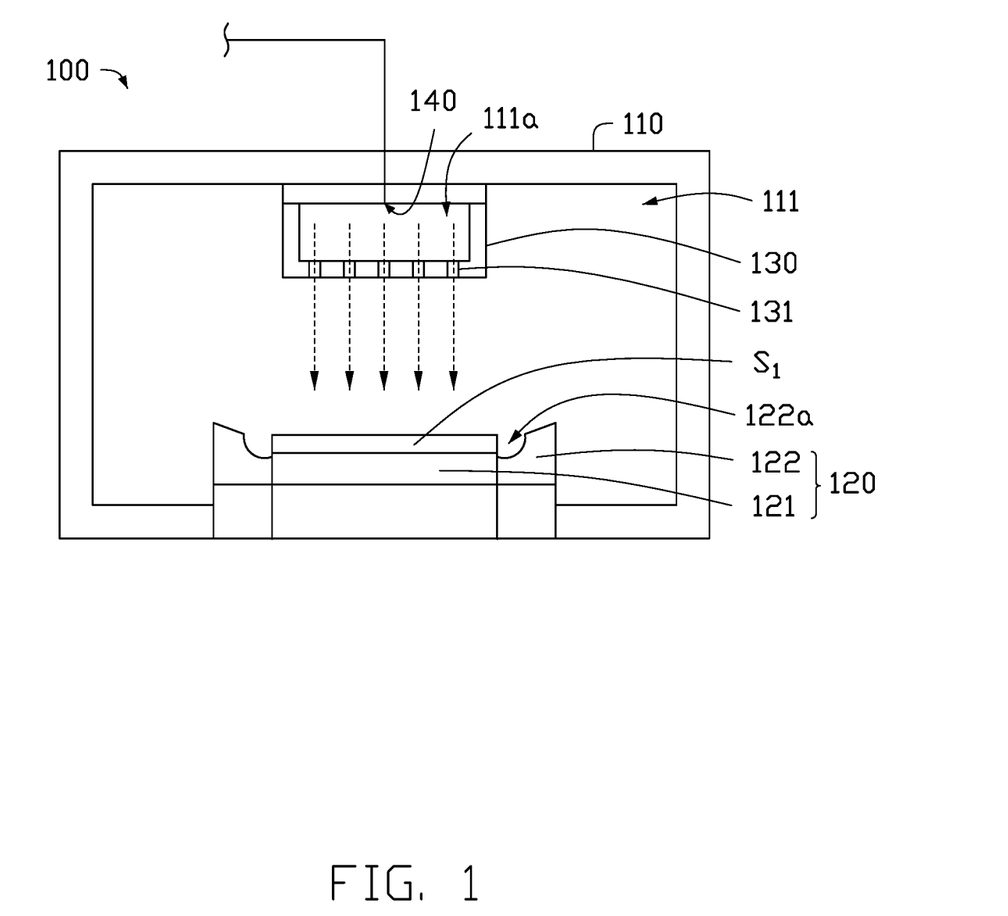
FIG. 1 illustrates a cross-sectional view of a semiconductor processing apparatus in accordance with some embodiments of the instant disclosure.

FIG. 1 illustrates a cross-sectional view of a semiconductor processing apparatus 100 in accordance with the instant disclosure.

The exemplary semiconductor processing apparatus 100 comprises a chamber body 110 having an interior volume 111. The interior volume 111 is coupled to a vacuum pump (not shown in FIG. 1) for vacuuming the interior volume 111.

A substrate support pedestal 120 is disposed in the interior volume 111 on a bottom of the chamber body 110 below the gas outlet member 130. The substrate support pedestal 120 is configured to support a substrate $S_1$. In the embodiment illustrated in FIG. 1, the substrate support pedestal 120 includes an electrostatic chuck (ESC) 121 and an edge ring 122 configured to laterally surround the substrate $S_1$.

A gas inlet 140 coupling to a gas source (not shown in FIG. 1) is positioned prior to a gas outlet member 130. The gas inlet 140 is utilized to introduce gas provided by the gas source in to a plenum 111a defined by the gas outlet member 130.

The gas outlet member 130 is positioned above the substrate support pedestal 120 inside the interior volume 111. The gas outlet member 130 includes a plurality of dispense nozzles 131. In the embodiment illustrated in FIG. 1, the dispense nozzles 132 are openings configured to allow gas inside the plenum 111a to move downwardly toward the substrate support pedestal 120.

In some embodiments of the instant disclosure, the semiconductor processing apparatus 100 may be configured to perform an etching process. In such embodiments, components of the semiconductor processing apparatus 100 may gradually be etched over time when etching processes are rapidly performed, that may result in deteriorated process uniformity. For example, the edge ring 122 laterally sounding the substrate $S_1$ may be etched. In some scenarios, inner side of the edge ring 122 that facing the substrate $S_1$ may be recessed by plasma to define a gap 122a that expose a lateral side of the substrate $S_1$. Consequently, plasma inside the interior volume 111 may flow into the gap 122a such that a plasma distribution over the substrate $S_1$ may be disturbed. Accordingly, CDs of features near the lateral edge of the substrate $S_1$ may not be maintained consistently in the subsequent processes, which may significantly affect yields.

In such scenarios, the demands for maintaining uniform plasma distribution over the substrate $S_1$ may require a reduction of maintenance cycle of the edge ring 122.

Figure 2:
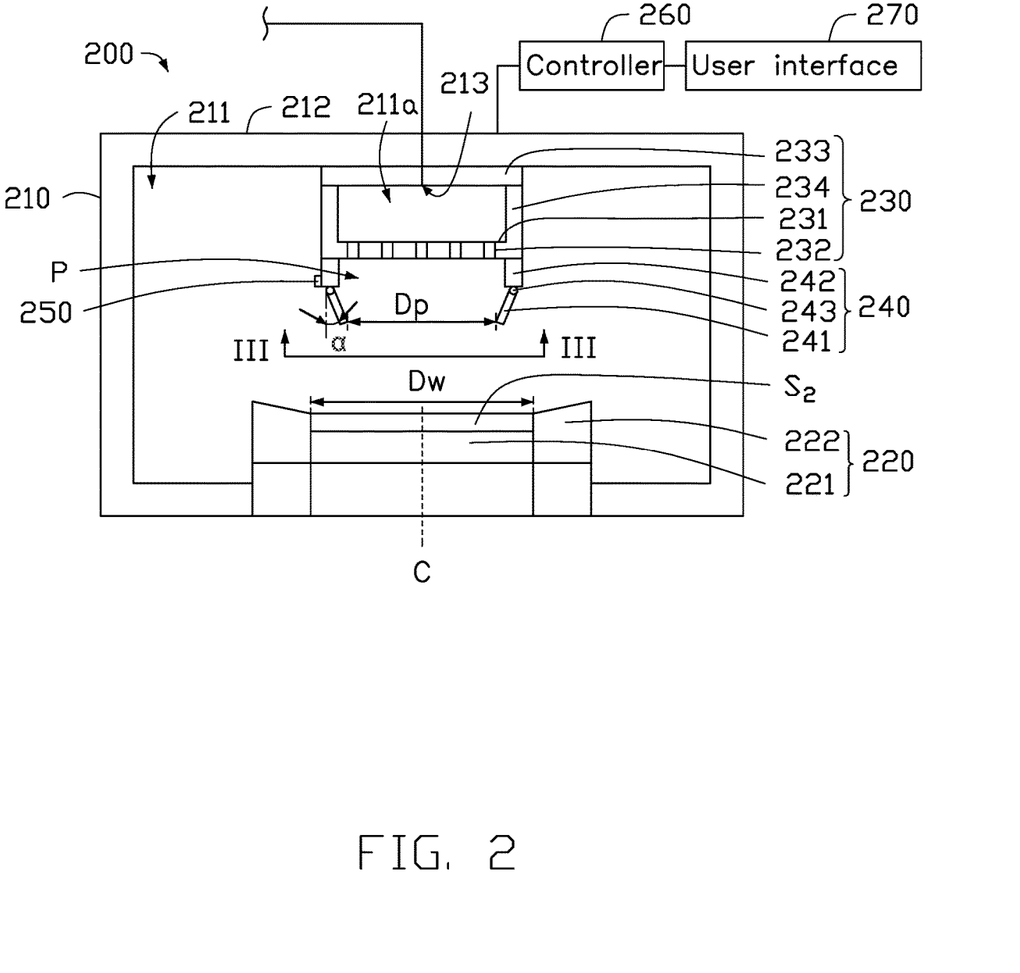
FIG. 2 illustrates a cross-sectional view of a semiconductor processing apparatus in accordance with some embodiments of the instant disclosure.

FIG. 2 illustrates a cross-sectional view of a semiconductor processing apparatus 200 in accordance with the instant disclosure.

The semiconductor processing apparatus 200 comprises a chamber body 210 having an interior volume 211. The interior volume 211 is coupled to a vacuum pump (not shown in FIG. 2) for vacuuming the interior volume 211. In some embodiments, the interior volume 211 may be couple to the vacuum pump through an exhaust port (not shown in FIG. 2) formed through a wall of the chamber body 210.

A substrate support pedestal 220 is disposed in the interior volume 211 on a bottom of the chamber body 210 below a gas outlet member 230. The substrate support pedestal 220 may be coupled to an RF bias source that is capable of producing an RF signal having a tunable frequency and a power. Optionally, the RF bias source may be a DC or pulsed DC source. The substrate support pedestal 220 may include an electrostatic chuck (ESC) 221 for concentrically retaining a substrate $S_2$ on a surface of the substrate support pedestal 220 during processing, and an edge ring 222 laterally surrounding the substrate $S_2$. The ESC 221 can be controlled by a DC power supply.

The gas inlet 213 is coupled to a gas source (not shown in FIG. 2) and be positioned above the gas outlet member 230. In the embodiment illustrated in FIG. 2, the gas inlet 213 is positioned in a top wall 212 of the chamber body 210. The gas inlet 213 is utilized to introduce gas provided by the gas source into a plenum 211a defined by the gas outlet member 230. In some embodiments of the instant disclosure, the gas inlet 213 is also known as a vortex inducing gas inlet that is configured to form a vortex circulating around a centerline of the chamber body 210 prior to passing through the gas outlet member 230.

The gas outlet member 230 is positioned inside the interior volume 211 above the substrate support pedestal 220. In the embodiment illustrated in FIG. 2, the gas outlet member 230 comprises a mounting plate 233, a plate body 231, and an annular outer wall 234. The mounting plate 233 is mounted with the top wall 212 and coupled to the plate body 231 by the annular outer wall 234. The plenum 211a is defined by the mounting plate 233, the plate body 231, and the annular outer wall 234. The plenum 211a may be cylindrical. In some embodiments, the may alternatively plenum 211a have other geometries. The plenum 211a is configured to accept gas form at least one gas inlet 213.

The plate body 231 includes a plurality of dispense nozzles 232. In some embodiments of instant disclosure, a dispense nozzle 232 can be a structure that allows gas inside the plenum 211a to leave the plenum 211a. For example, the dispense nozzle 232 can be a projecting vent, or a short tube with a taper or constriction used to direct a flow of gas. In the embodiment illustrated in FIG. 2, the dispense nozzles 232 may be openings formed on the plate body 231 configured to allow gas inside the plenum 211a to move downwardly toward the substrate support pedestal 220.

A gas guiding device 240 comprises a guide ring 242 configured to be arranged around the dispense nozzles 232, and a plurality of petal elements 241. The petal elements 241 are pivotally arranged around the dispense nozzles 232 of the gas outlet member 230 and circumferentially overlapping one another. In the embodiment in FIG. 2, the guiding ring 242 is mounted on the gas outlet member 230. The petal elements 241 are pivotally attached to the guide ring 242 and circumferentially overlapped one another in an encircling arrangement.

The gas guiding device 240 is configured to be arranged between the gas outlet member 230 and the substrate $S_2$. In some embodiments of according to instant disclosure, the gas guiding device 240 is positioned between the gas outlet member 230 and the substrate support pedestal 220 in a height direction. For example, the guide ring 242 may be mounted laterally on the gas outlet member 230 in a way that the petal elements 241 are positioned between the gas outlet member 230 and the substrate support pedestal 220 in the height direction. In the embodiment illustrated in FIG. 2, the guide ring 242 is mounted on a bottom surface of the gas outlet member 230 that the guide ring 242 and the petal elements 241 are positioned between the gas outlet member 230 and the substrate support pedestal 220 in the height direction.

The guide ring 242 may include metal. For example, the guide ring 242 may selectively comprise steel and stainless steel. In some embodiments of the instant disclosure, the guide ring 242 comprise stainless steel. In some embodiments of the instant disclosure, the guide ring 242 comprise ceramic material.

The petal elements 241 includes metal. For example, the petals elements 241 may selectively comprise steel and stainless steel. In some embodiments of the instant disclosure, the petal elements 241 comprise stainless steel. In some embodiments of the instant disclosure, the petal elements 241 comprise ceramic material.

In some embodiments of the instant disclosure, each of the petals elements 241 may comprise a coating layer. In such embodiments, the petals elements 241 are able to withstand plasma and less likely be damaged during processes (e.g. etching process) performed by the apparatus 200. In some embodiments of the instant disclosure, the guide ring 242 may also comprise a coating layer.

In some embodiments according to the instant disclosure, the petal elements 241 may be pivotally attached to the gas outlet member 230. In such embodiments, the guiding ring 242 can be omitted.

The petal elements 241 are configured to dynamically adjust an output gas distribution over the substrate support pedestal 220. In one scenario, when the substrate $S_2$ is supported on the substrate support pedestal 220, the output gas is distributed over the substrate $S_2$. The shape of the passage P defined by the gas guiding device 240 is a crucial factor that whether the output gas distribution can be adjusted ideally. To that end, the petal elements 241 in the instant exemplary embodiment are arranged in a circumferentially overlapping manner, which enables them to cooperatively define an adjustable passage P that has a substantially circumferentially continuous boundary. For instance, gas stream from the gas outlet member 230 through the gas guiding device 240 would be deflected by the collection of petal elements 241. The gas stream may remain laminar and continuously reaches the circumferential edge of the petals without leaking there-between. The shape of the passage P can be controlled by driving the petal elements. The petal elements 241 may be driven to pivotally move toward or away from a central line C of the substrate $S_2$ together while retaining the circular overlapping arrangement, thereby enable tuning of the shape of the passage P Accordingly, the output gas distribution over the substrate support pedestal 220 may be controlled.

In some embodiments of the instant disclosure, at least one of the plurality of petal elements 241 is configured to receive an external driving source that provides actuating actions, thereby enabling the pivotal control of the petal elements 241 toward or away a central line C of the substrate support pedestal 220 when a driving force is provided.

Figure 3:
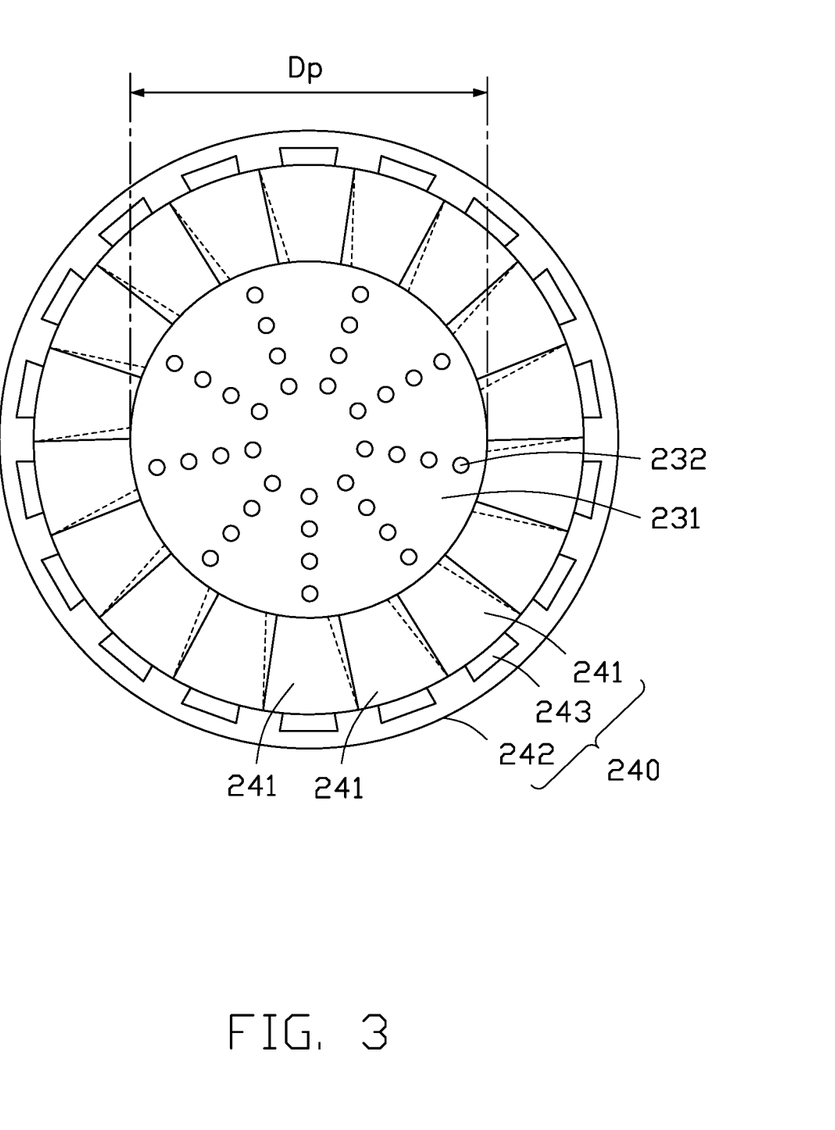
FIG. 3 illustrated a bottom view of a gas guiding device in accordance with some embodiments of the instant disclosure taken along a III-III line in FIG. 2.

Referring to FIG. 3, which is a bottom view of the guiding device 240 taken along a III-III line in FIG. 2. As previously described, the petal elements 241 are circumferentially overlapped one another in an encircling arrangement, thereby the petal elements 241 may be interlocked. Consequently, in the embodiment illustrated in FIG. 3, when one of the petal elements 241 pivots, the motion is transmitted from the driven one to an adjacent one of the petal elements 241. In such embodiments, all the petal elements 241 may pivot simultaneously when only one of them is being driven.

In the embodiments illustrated in FIG. 2, each of the petal elements 241 is coupled to an actuator 243 configured to provide driving force to adjust pivotal action of the petal elements 241. A driving mechanism may include a motor 250 coupled to at least one of the plurality of petal elements 241 via the respective one of the actuators 243. In such embodiments, the petal elements 241 can be driven by the motor 250. With the driving force from the actuator 243, the petal elements 241 can be pivotally movable toward or away a central line C of the substrate support pedestal 220 while retaining the circumferential overlapping arrangement.

In some embodiments of the instant disclosure, the driving mechanism may further comprise a controller 260 electronically connected to the motor 250 and a user interface 270 positioned outside the chamber body 210. In such embodiments, operators may control motor 250 via operating the user interface 270.

In some embodiments, the petal elements 241 may be pivotally coupled to the guide ring 242 via a hinge such that the petal elements 241 can be driven by hands. In such embodiments, the driving mechanism and the actuators 243 may be omitted.

In the embodiments illustrated in FIG. 2, an angel a between α vertical line L and each of the plurality of the petal elements 241 can be adjustable in a range from about 0 to 90 degree. In some embodiments of the instant disclosure, the angel α is in a range from about 0 to 45 degree. With such range of the angel α, the passage P may be retained in a shape that beneficial for adjusting the output gas distribution over the substrate $S_2$.

In the embodiments illustrated in FIG. 2, a ratio between a diameter $D_p$ of the opening defined by tips of the plurality of the petal elements 241 and a diameter $D_w$ of the substrate $S_2$ on the substrate support pedestal 220 may be adjustable in a range from about 90% to 110%. In one embodiment, the ratio is from about 95% to 105%. With such ratio, output gas distribution over lateral portion of the substrate $S_2$ may be well adjusted.

In some embodiments of the instant disclosure, the diameter $D_p$ of an opening defined by tips of the plurality of the petal elements 241 is adjustable in a range from about 295 mm to 305 mm. In one scenario, the diameter $D_w$ of the substrate $S_2$ is 300 mm, consequently the diameter variation between the opening and the substrate $S_2$ is less than 5 mm. In such scenario, the ratio between diameter $D_p$ of the opening defined by tips of the plurality of the petal elements 241 and the diameter $D_w$ of the substrate $S_2$ is in a range from about 98% to 102%, which is within the range from about 95% to 105%.

Figure 4:
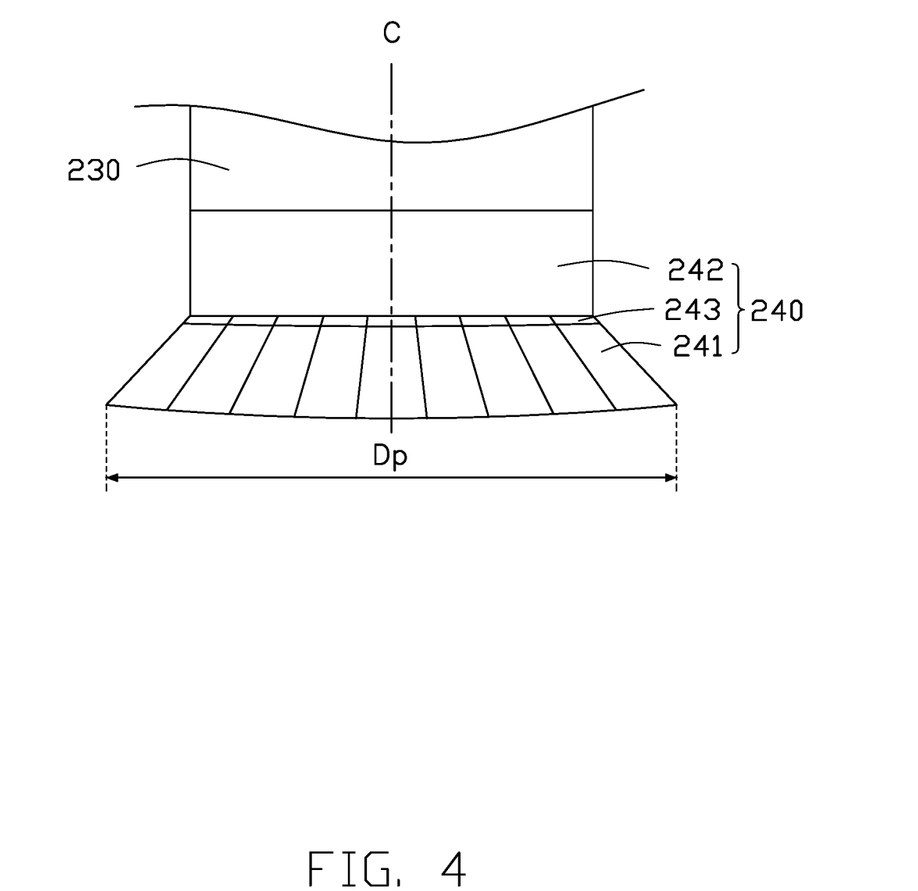
FIG. 4 illustrated a side view of a gas guiding device in accordance with some embodiments of the instant disclosure.
Figure 5:
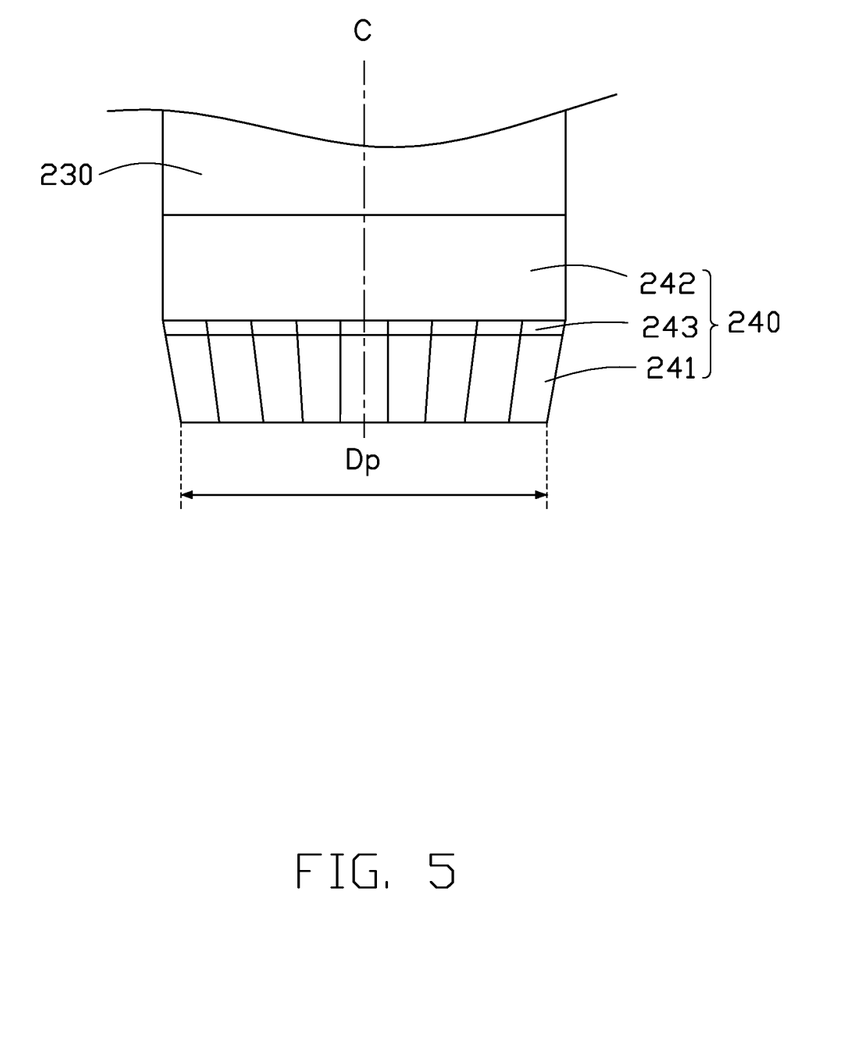
FIG. 5 illustrated a side view of a gas guiding device in accordance with some embodiments of the instant disclosure.

FIG. 4 and FIG. 5 are schematic figures respectively showing two different diameter $D_w$ of the opening defined by tips of the petal elements. The diameter $D_w$ can be increased by pivoting the petal elements 241 toward the central line C, and can be reduced by pivoting the petal elements 241 toward the central line C.

In some scenarios, the edge ring 222 may be etched, therefore plasma inside interior volume 211 may flow to the lateral edge of the substrate $S_2$ such that features thereon may be over etched. In such scenarios, when monitoring the features of the substrate $S_2$, one can find that the actual sizes of features near the lateral edge may be smaller than an expected CD size. The demands for maintaining the expected CD size in the subsequent processes may require driving the petal elements 241 to pivot toward the central line C.

Figure 6:
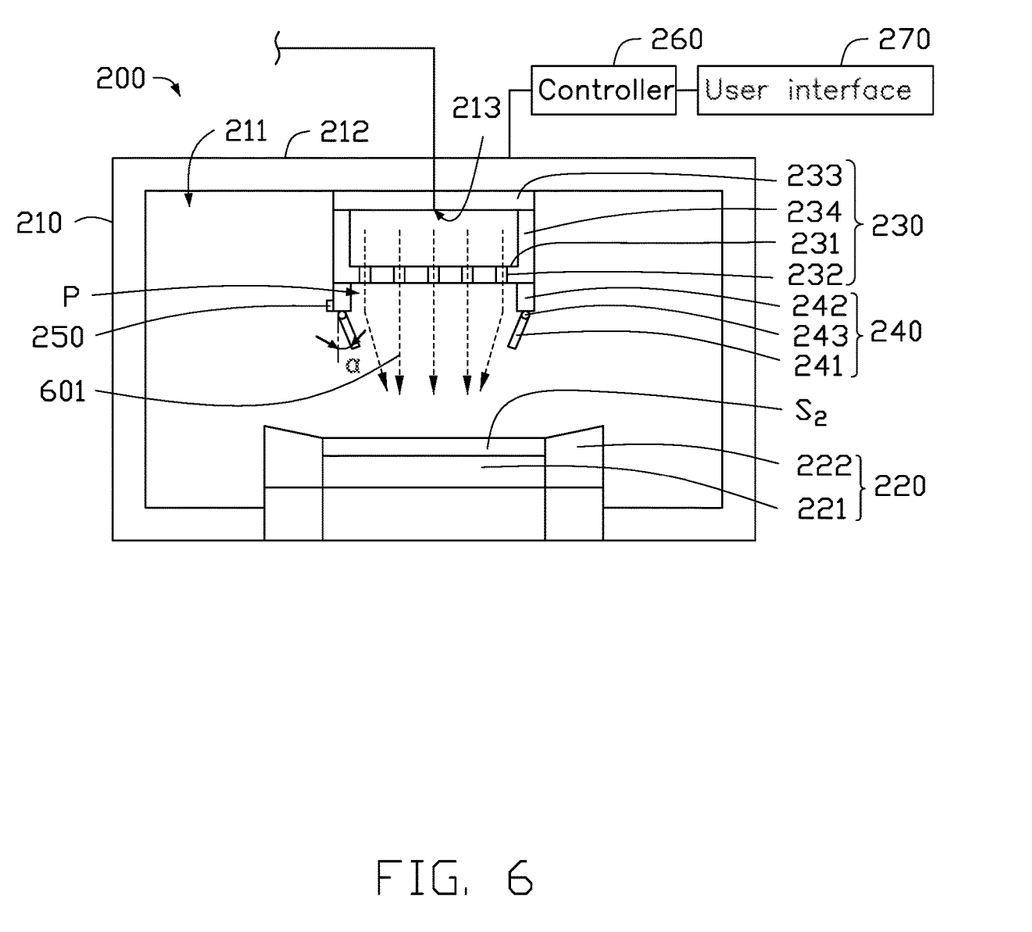
FIG. 6 illustrates a cross-sectional view of a semiconductor processing apparatus having a gas flows in a converging path downwardly in accordance with some embodiments of the instant disclosure.

Referring to FIG. 6, which shows that the petal elements 241 have been driven to pivot toward the central line C. Gas 601 leaving from the gas outlet member 230 may flow in a converging path in a downward direction so as to form a narrower output gas distribution over the substrate $S_2$. As a result, the monitored actual sizes of features near the lateral side of the substrate $S_2$ in subsequent processes may be maintained substantially consistent with the expected CD size.

In some scenarios, the monitored actual sizes of features near the lateral side of the substrate $S_2$ may be larger than an expected CD size. For example, when the petal elements 241 was previously over pivoted toward the central line C of the substrate support pedestal 220, the output gas distribution over the substrate $S_2$ may be too narrow. Consequently, features in lateral edge of the substrate $S_2$ may be insufficiently etched. In such scenarios, the petal elements 241 may be driven to pivot away from the central line C to generate a wider gas distribution over the substrate $S_2$ to maintain the actual sizes of features near the lateral side in subsequent processes.

Figure 7:
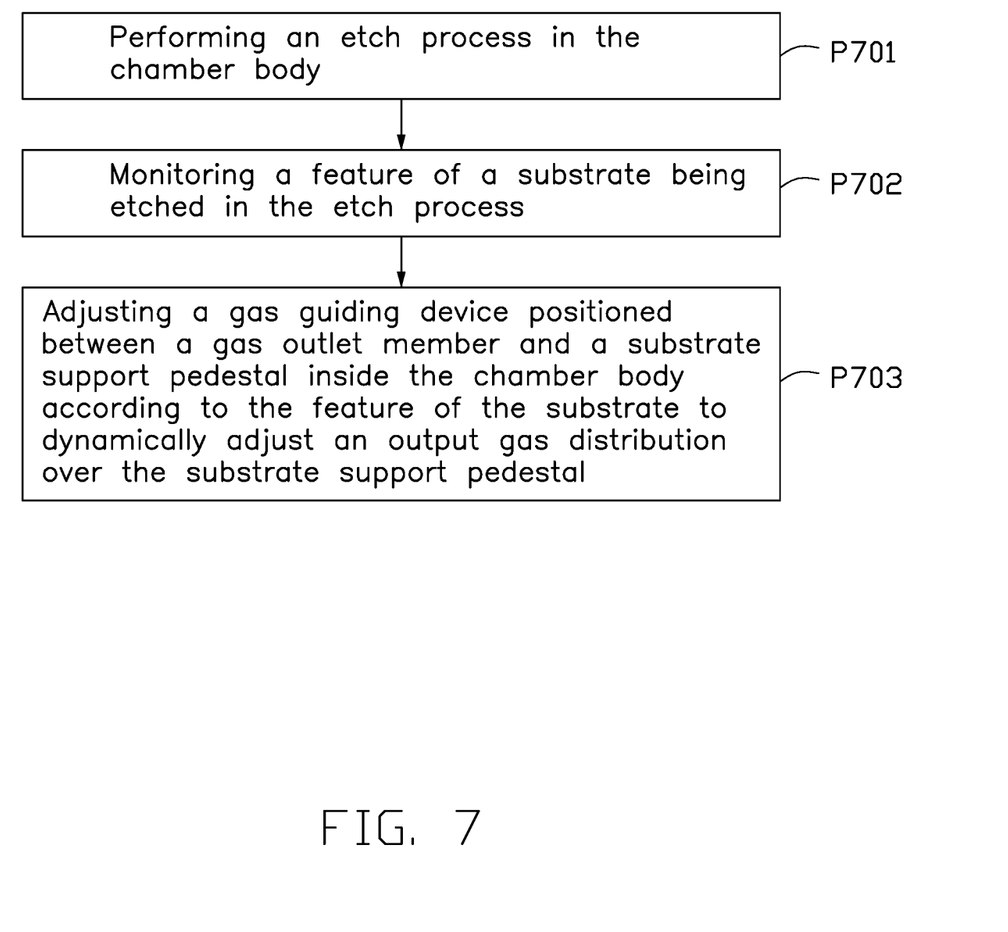
FIG. 7 s a flow chart illustrating a method for processing a semiconductor substrate in accordance with some embodiments of the instant disclosure.

FIG. 7 is a flow chart illustrating a method for processing a semiconductor device (e.g. substrate $S_2$) inside a chamber body (e.g. chamber body 210) according some embodiments of the instant disclosure.

Process P701: Performing an etch process in the chamber body.

Process P702: Monitoring a feature of a substrate (e.g. substrate $S_2$) being etched in the etch process.

Process P703: Adjusting a gas guiding device (e.g. gas guiding device 240) positioned between a gas outlet member (e.g. gas outlet member 230) and a substrate support pedestal (e.g. substrate support pedestal 220) inside the chamber body according to the feature of the substrate to dynamically adjust an output gas distribution over the substrate support pedestal. The gas guiding device defines an adjustable passage with a substantially circumferentially continuous boundary.

In some embodiments of the instant disclosure, the Process P703 includes adjusting at least one of the plurality of petal elements according to the feature of the substrate in a way that the petal elements pivotally move toward or away from a central line of the substrate together retaining the circular overlapping arrangement to tune the shape of the passage.

In some embodiments of the instant disclosure, in Process P703, an angel between a vertical line (e.g. vertical line L) and each of the plurality of the petal elements is ranged from about 0 to 45 degree.

In some embodiments of the instant disclosure, in Process P703, a diameter (e.g. $D_p$) of an opening defined by tips of the plurality of the petal elements is in a range from about 295 mm to 305 mm.

In some embodiments of the instant disclosure, in Process P703, a ratio between a diameter (e.g. $D_w$) of the substrate and the diameter of the opening defined by tips of the plurality of the petal elements is in a range from about 95% to 105%.

In some embodiments of the instant disclosure, in Process P703 a user interface (e.g. user interface 270) is operated so that a driving mechanism (e.g. motor 250 coupled with controller 260) electronically connected to the user interface drives the plurality of petal elements.

One aspect of the instant disclosure provides a semiconductor processing apparatus. The semiconductor processing apparatus comprises a chamber body having an interior volume; a substrate support pedestal disposed in the interior volume; a gas outlet member positioned above the substrate support pedestal inside the interior volume , having a plurality of dispense nozzles; and a gas guiding device positioned between the gas outlet member and the substrate support pedestal. The gas guiding device includes a plurality of petal elements pivotally arranged around the dispense nozzles of the gas outlet member and circumferentially overlapping one another, configured to dynamically adjust an output gas distribution over the substrate support pedestal.

In some embodiments of the instant disclosure, the chamber body includes a top wall. The gas outlet member comprises a mounting plate mounted with the top wall, an annular outer wall. The plate body coupled to the mounting plate by the annular outer wall, and a plenum defined by the mounting plate, the annular outer wall and the plate body. The plurality of dispense nozzles are formed on the plate body and configured to allow gas inside the plenum to move downwardly toward the substrate support pedestal.

In some embodiments of the instant disclosure, the gas guiding device further comprising a guide ring mounted on the gas outlet member. The plurality of petal elements are pivotally attached to the guiding ring.

In some embodiments of the instant disclosure, the semiconductor processing apparatus further comprising a motor coupled to at least one of the plurality of petal elements so that the petal elements are pivotally movable toward or away a central line of the substrate support pedestal while retaining the circumferential overlapping arrangement.

In some embodiments of the instant disclosure, the semiconductor processing apparatus further comprising a controller electronically connected to the actuator and a user interface positioned outside the chamber body, electronically connected to the controller.

In some embodiments of the instant disclosure, an angel a between a vertical line and each of the plurality of the petal elements is adjustable in a range from about 0 to 45 degree.

In some embodiments of the instant disclosure, a diameter of an opening defined by tips of the plurality of the petal elements is adjustable in a range from about 295 mm to 305 mm.

In some embodiments of the instant disclosure, a ratio between the diameter of the opening defined by tips of the plurality of the petal elements and a diameter of a substrate supported on the substrate support pedestal is in a range from about 95% to 105%.

In some embodiments of the instant disclosure, the plurality of the petals elements includes metal.

In some embodiments of the instant disclosure, the guide ring includes metal.

In some embodiments of the instant disclosure, each of the petals elements further comprising a coating layer.

One aspect of the instant disclosure provides a method for processing a semiconductor device inside a chamber body. The method comprises performing an etch process in the chamber body, monitoring a feature of a substrate being etched in the etch process, and adjusting a gas guiding device positioned between a gas outlet member and a substrate support pedestal inside the chamber body according to the feature of the substrate to dynamically adjust an output gas distribution over the substrate support pedestal, wherein the gas guiding device defines an adjustable passage with a substantially circumferentially continuous boundary.

In some embodiments of the instant disclosure, the gas guiding device includes a plurality of petal elements pivotally arranged around the gas outlet member and circumferentially overlapping one another, configured to dynamically adjust an output gas distribution over the substrate support pedestal. The adjusting the gas guiding device includes adjusting at least one of the plurality of petal elements according to the feature of the substrate in a way that the petal elements pivotally move toward or away from a central line of the substrate together retaining the circular overlapping arrangement to tune the shape of the passage.

In some embodiments of the instant disclosure, when adjusting at least one of the plurality of petal elements, an angel between a vertical line and each of the plurality of the petal elements is ranged from about 0 to 45 degree.

In some embodiments of the instant disclosure, when adjusting at least one of the plurality of petal elements, a diameter of an opening defined by tips of the plurality of the petal elements is in a range from about 295 mm to 305 mm.

In some embodiments of the instant disclosure, when adjusting at least one of the plurality of petal elements, a ratio between the diameter of the opening defined by tips of the plurality of the petal elements and a diameter of a substrate supported on the substrate support pedestal is in a range from about 95% to 105%.

In some embodiments of the instant disclosure, when adjusting at least one of the plurality of petal elements, a user interface is operated so that a driving mechanism electronically connected to the user interface drives the plurality of petal elements.

One aspect of instant disclosure provides a gas guiding device configured to be arranged between a gas outlet member having a plurality of dispense nozzles and a substrate support pedestal,. The gas guiding device comprises a guide ring configured to be arranged around the dispense nozzles, and a plurality of petal elements pivotally attached to the guide ring and circumferentially overlapped one another in an encircling arrangement, configured to dynamically adjust an output gas distribution over the substrate.

In some embodiments of the instant disclosure, an angel between a vertical line and each of the plurality of the petal elements is adjustably in a range from about 0 to 45 degree.

In some embodiments of the instant disclosure, a diameter of an opening defined by tips of the plurality of the petal elements is adjustably in a range from about 295 mm to 305 mm.

The embodiments shown and described above are only examples. Many details are often found in the art such as the other features of a radiation measurement panel and device. Therefore, many such details are neither shown nor described. Even though numerous characteristics and advantages of the present technology have been set forth in the foregoing description, together with details of the structure and function , the disclosure is illustrative only, and changes may be made in the detail, especially in matters of shape, size, and arrangement of the parts within the principles , up to and including the full extent established by the broad general meaning of the terms used in the claims. It will therefore be appreciated that the embodiments described above may be modified within the scope of the claims.

What is claimed is:

1. A semiconductor processing apparatus, comprising:
a chamber body having an interior volume;
a substrate support pedestal disposed in the interior volume;
a gas outlet member positioned above the substrate support pedestal inside the interior volume, having a plurality of dispense nozzles; and
a gas guiding device positioned between the gas outlet member and the substrate support pedestal, the gas guiding device including
a plurality of petal elements pivotally arranged around the dispense nozzles of the gas outlet member and circumferentially overlapping one another, configured to dynamically adjust an output gas distribution over the substrate support pedestal.

2. The apparatus of claim 1,
wherein the chamber body includes a top wall;
wherein the gas outlet member comprises a mounting plate mounted with the top wall, an annular outer wall, and a plate body coupled to the mounting plate by the annular outer wall, wherein a plenum is defined by the mounting plate, the annular outer wall and the plate body;
wherein the plurality of dispense nozzles are formed on the plate body and configured to allow gas inside the plenum to move downwardly toward the substrate support pedestal.

3. The apparatus of claim 1, wherein the gas guiding device further comprising:
a guide ring mounted on the gas outlet member;
wherein the plurality of petal elements are pivotally attached to the guide ring.

4. The apparatus of claim 1, further comprising:
a motor coupled to at least one of the plurality of petal elements so that the petal elements are pivotally movable toward or away a central line of the substrate support pedestal while retaining the circumferential overlapping arrangement.

5. The apparatus of claim 4, further comprising:
a controller electronically connected to the actuator; and
a user interface positioned outside the chamber body, electronically connected to the controller.

6. The apparatus of claim 1, wherein
an angel between a vertical line and each of the plurality of the petal elements is adjustable in a range from about 0 to 45 degree.

7. The apparatus of claim 1, wherein
a diameter of an opening defined by tips of the plurality of the petal elements is adjustable in a range from about 295 mm to 305 mm.

8. The apparatus of claim 7, wherein
a ratio between the diameter of the opening defined by tips of the plurality of the petal elements and a diameter of a substrate supported on the substrate support pedestal is in a range from about 95% to 105%.

9. The apparatus of claim 1, wherein
the plurality of the petals elements includes metal.

10. The apparatus of claim 1, wherein,
the guide ring includes metal.

11. The apparatus of claim 1, wherein,
each of the petal elements further comprising a coating layer.

12. A gas guiding device, configured to be arranged between a gas outlet member having a plurality of dispense nozzles and a substrate support pedestal, the device comprising:
   a guide ring configured to be arranged around the dispense nozzles; and
   a plurality of petal elements pivotally attached to the guide ring and circumferentially overlapped one another in an encircling arrangement, configured to dynamically adjust an output gas distribution over the substrate.

13. The device of claim 12, wherein
   an angel between a vertical line and each of the plurality of the petal elements is adjustably in a range from about 0 to 45 degree.

14. The device of claim 12, wherein
   a diameter of an opening defined by tips of the plurality of the petal elements is adjustably in a range from about 295 mm to 305 mm.

* * * * *